(12) United States Patent
Hsu et al.

(10) Patent No.: US 8,110,845 B2
(45) Date of Patent: Feb. 7, 2012

(54) LIGHT-EMITTING DEVICE CONTAINING A COMPOSITE ELECTROPLATED SUBSTRATE

(75) Inventors: Chia-Liang Hsu, Changhua County (TW); Min-Hsun Hsieh, Hsinchu (TW); Chih-Chiang Lu, Hsinchu County (TW); Chien-Fu Huang, Chiayi (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/181,222

(22) Filed: Jul. 12, 2011

(65) Prior Publication Data

US 2011/0266581 A1 Nov. 3, 2011

Related U.S. Application Data

(62) Division of application No. 12/533,211, filed on Jul. 31, 2009.

(30) Foreign Application Priority Data

Aug. 1, 2008 (TW) ................. 97129481 A

(51) Int. Cl.
  *H01L 33/00* (2010.01)
(52) U.S. Cl. ...... 257/98; 257/94; 257/103; 257/E33.008
(58) Field of Classification Search ............. 257/94, 257/98, 103, E33.008, E33.013
  See application file for complete search history.

(56) References Cited

U.S. PATENT DOCUMENTS

| | | |
|---|---|---|
| 2004/0026703 A1 | 2/2004 | Adomi et al. |
| 2005/0194587 A1 | 9/2005 | Hsieh et al. |
| 2006/0286697 A1 | 12/2006 | Leem |
| 2009/0014738 A1 | 1/2009 | Shiue et al. |
| 2009/0294908 A1 | 12/2009 | Yang et al. |

FOREIGN PATENT DOCUMENTS

JP 2007081333 3/2007

*Primary Examiner* — Cuong Q Nguyen
*Assistant Examiner* — Tran Tran
(74) *Attorney, Agent, or Firm* — Muncy, Geissler, Olds & Lowe, PLLC

(57) ABSTRACT

The application is related to a method of forming a substrate of a light-emitting diode by composite electroplating. The application illustrates a light-emitting diode comprising the following elements: a light-emitting epitaxy structure, a reflective layer disposed on the light-emitting epitaxy structure, a seed layer disposed on the reflective layer, a composite electroplating substrate disposed on the seed layer by composite electroplating, and a protection layer disposed on the composite electroplating substrate.

13 Claims, 10 Drawing Sheets

LIGHT-EMITTING DEVICE CONTAINING A COMPOSITE ELECTROPLATED SUBSTRATE

CROSS REFERENCE TO RELATED APPLICATIONS

This application is a Divisional of co-pending application Ser. No. 12/533,211, filed on 31 Jul. 2009, and for which priority is claimed under 35 U.S.C. §120; and this application claims priority of application number 097129481 entitled "A Light-Emitting Device Containing a Composite Electroplated Substrate", filed on 1 Aug. 2008 in Taiwan under 35 U.S.C. §119; the entire contents of all of which are hereby incorporated by reference.

TECHNICAL FIELD

The present application generally relates to a light-emitting device, and more particularly to a light-emitting diode comprising a composite electroplated substrate.

BACKGROUND

The vertical type light-emitting diodes (LEDs) become a popular choice to light-emitting diodes package for its simple design, high power, high efficiency, and long life-time. To optimize the heat dispersion, the light-emitting diodes are usually attached to the metal substrate by bonding technology, or by electroplating technology to evaporate metal film on the epitaxy layers. However, due to the difference of the thermal expansion coefficients of materials, the light-emitting diode wafer often cracks during the manufacturing which influences the wafer life-time indirectly.

Generally, a metal matrix composite material is produced by fusing materials having low thermal expansion coefficient with metals having high thermal conductivity in a high temperature process to achieve high thermal conductivity and low thermal expansion coefficient. However, the high temperature process does not suit for light-emitting diode chip manufacturing. Recently, the composite electroplating has developed vigorously. The various kinds of composite material compositions have been developed and used in the surface coating for the purpose of wear-resisting and waterproof. Taking the nickel-silicon carbide composite electroplating as an example, the principle is to precipitate and co-coat nickel and silicon carbide on the substrate by the electroplating solution containing the nickel ions with the inert silicon carbide particles suspended therein. When there is stress existed between the composite electroplating layer and the substrate, the material(s) selection of the interfacial layer, the number of layers, and the thickness of each layer are important topics for considering.

SUMMARY

In one embodiment of the present application, a light-emitting diode includes a light-emitting epitaxy structure, a reflective layer on the light-emitting epitaxy structure, a seed layer on the reflective layer, a composite electroplating substrate on the seed layer, and a protection layer on the composite electroplating substrate.

In one embodiment of the present application, a light-emitting diode further includes an interfacial layer between the seed layer and the composite electroplating substrate.

In one embodiment of the present application, a light-emitting diode further includes an intermediate layer between the reflective layer and the seed layer.

In one embodiment of the present application, a light-emitting diode further includes a multiple-film layer stacked alternately by multiple high strength films and multiple high toughness films between the reflective layer and the seed layer.

In one embodiment of the present application, a light-emitting diode comprises an interfacial layer wherein the material of the interfacial layer can be copper, gold, or nickel.

In one embodiment of the present application, a light-emitting diode comprises a reflective layer wherein the material of the reflective layer can be as a stack of titanium/aluminum, titanium/gold, or titanium/silver.

In one embodiment of the present application, a light-emitting diode comprises a seed layer wherein the material of the seed layer can be as a stack of titanium/gold, titanium/copper, chromium/gold, or chromium/platinum/gold.

In one embodiment of the present application, a light-emitting diode comprises a composite electroplating substrate is formed by the composite electroplating method wherein the material of the composite electroplating substrate can be copper-diamond, copper-silicon carbide, nickel-silicon carbide, carbon nanotube-nickel, carbon nanotube-copper, or carbon nanofiber-copper.

In one embodiment of the present application, a light-emitting diode comprises a protection layer wherein the material of the protection layer can be gold or nickel.

In one embodiment of the present application, a light-emitting diode comprises an intermediate layer wherein the material of the intermediate layer can be nickel, nickel cobalt, copper tungsten, copper molybdenum, nickel phosphorus alloy, or nickel ion alloy.

In one embodiment of the present application, a light-emitting diode comprises a multiple-film layer stacked alternately by multiple high strength films and multiple high toughness films, wherein the material of the multiple-film layer can be as a stack of aluminum nitride/aluminum, aluminum nitride/copper, or titanium tungsten/aluminum.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1A:
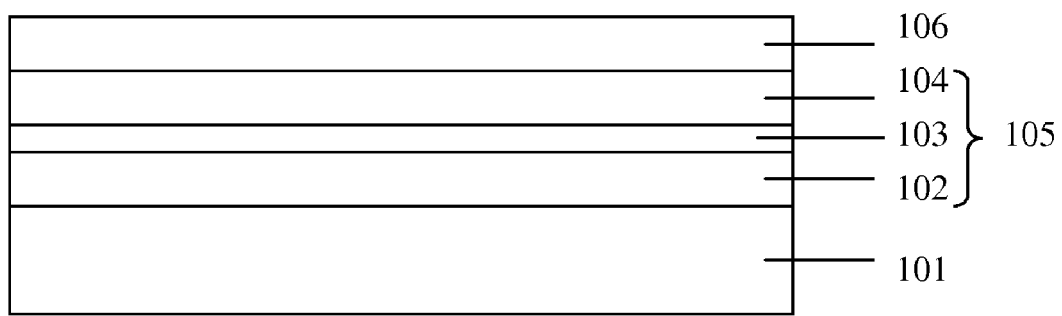
FIGS. 1A-1F illustrate a process flow of forming a light-emitting diode in accordance with one embodiment of the present application.

The first embodiment of the present application is illustrated in FIG. 1A to FIG. 1F. Referring to FIG. 1A, a growth substrate 101 is provided. A semiconductor epitaxy structure 105 is formed on the growth substrate, included at least a first conductivity type semiconductor layer 102, an active layer 103, and a second conductivity type semiconductor layer 104. In this embodiment, the first conductivity type semiconductor layer 102 is an n-GaN layer, the active layer 103 is an InGaN/GaN multiple quantum wells structure, and the second conductivity type semiconductor layer 104 is a p-GaN layer. The semiconductor epitaxy structure 105 is formed on sapphire by the epitaxy technology. The reflective layer 106 is formed on the semiconductor epitaxy structure 105 as a stack of titanium (thickness is 30 nm)/aluminum (thickness is 200 nm). It can also be as a stack of titanium/gold or titanium/silver.

Figure 1B:
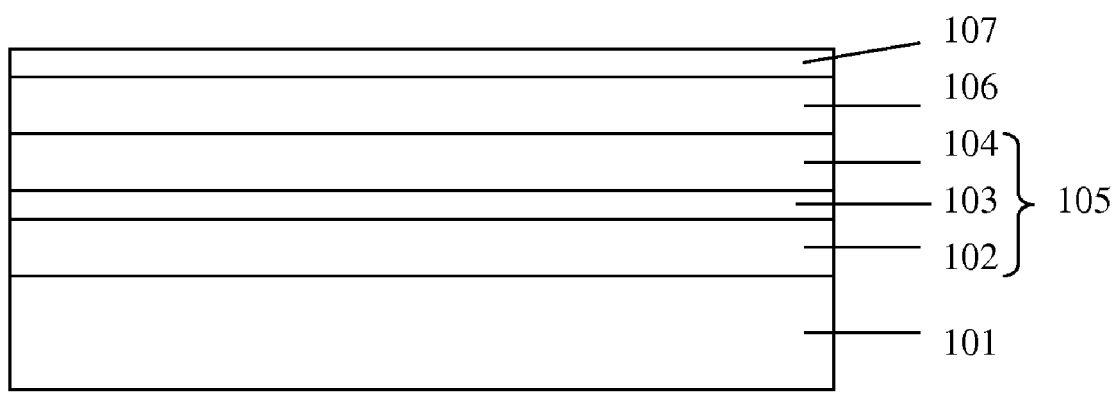
Figure 1C:
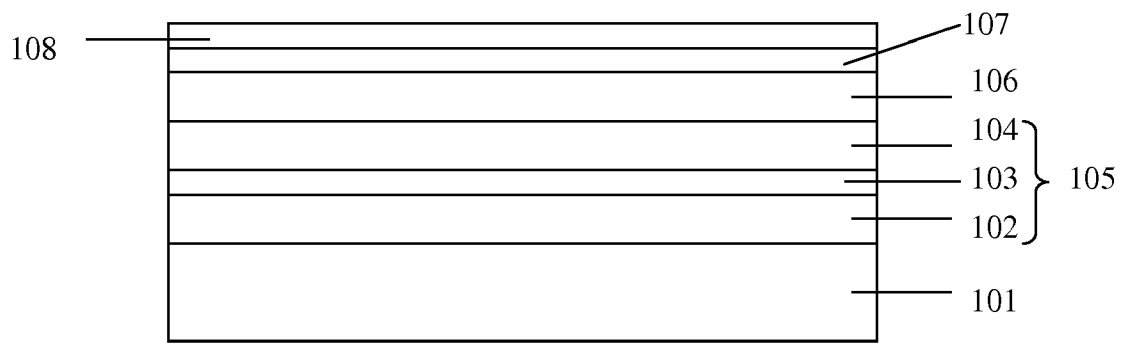
Figure 1D:
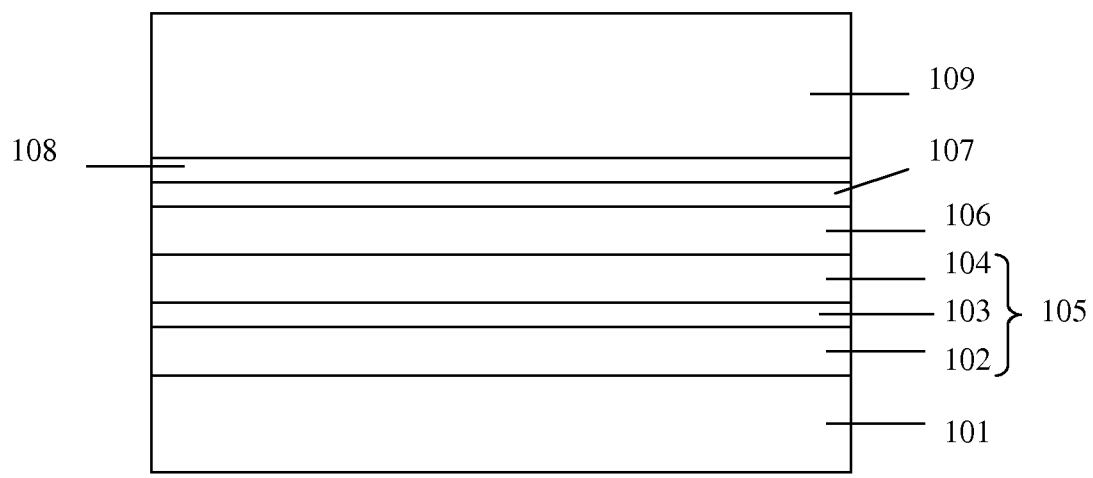

Referring to FIG. 1B, a seed layer 107 is formed on the reflective layer 106 to form a stack of titanium (thickness is 30 nm)/gold (thickness is 200 nm). It can also be as a stack of titanium/copper, chromium/gold, or chromium/platinum/gold. Referring to FIG. 1C, an intermediate layer 108 is formed on the seed layer 107, and can be composed of copper with a thickness of 3-5 μm in this embodiment. The intermediate layer can be a single layer or multiple layers structure. It also can be composed of gold or nickel. The above-mentioned structure is disposed in the copper ion electroplating solution with diamond powder suspended therein to perform a composite electroplating process. A composite electroplating substrate 109 is then formed by the copper and the diamond precipitating on the intermediate layer, as shown in FIG. 1D. The composite electroplating substrate can be a single layer or multiple layers structure. The material of the composite electroplating substrate can also be copper-silicon carbide, nickel-silicon carbide, carbon nanotube-nickel, carbon nanotube-copper, or carbon nano fiber-copper.

Figure 1E:
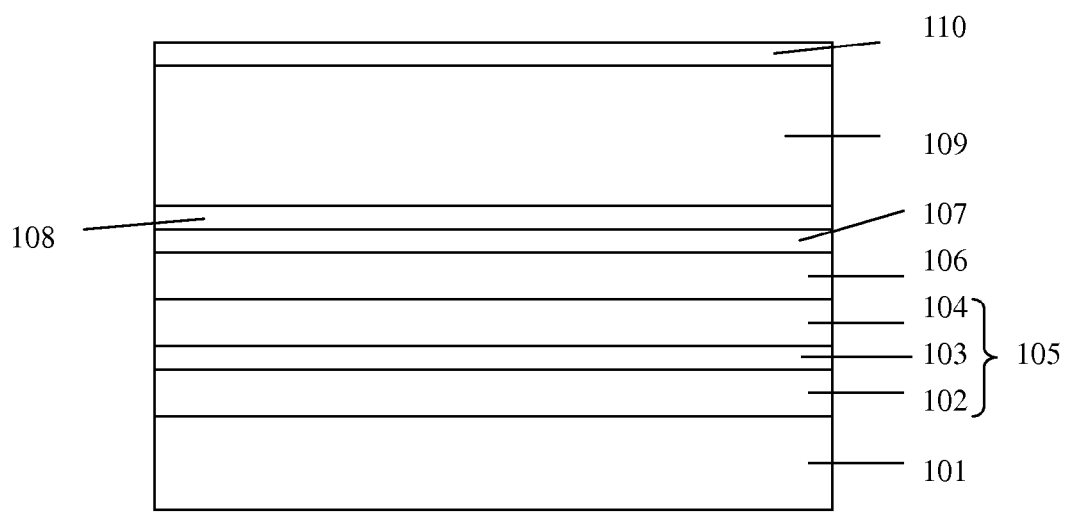
Figure 1F:
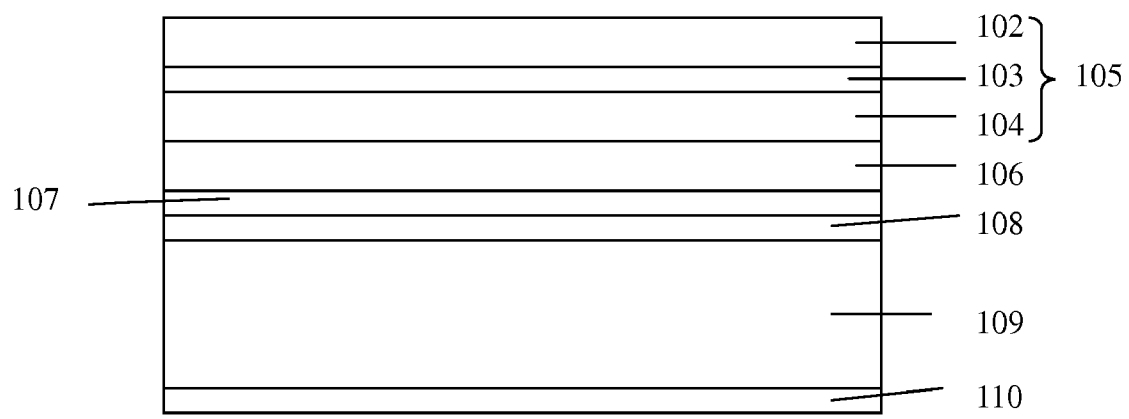

The protection layer 110 is formed on the composite electroplating substrate because the diamond particles can influence the coating layer surface coarseness and oxidize copper greatly. The protection layer can be a single layer or multiple layers structure. The material of the protection layer can be gold or nickel, as shown in FIG. 1E. Finally, the growth substrate 101 is removed, and the light-emitting diode structure with composite electroplated substrate is formed as shown in FIG. 1F.

Figure 2A:
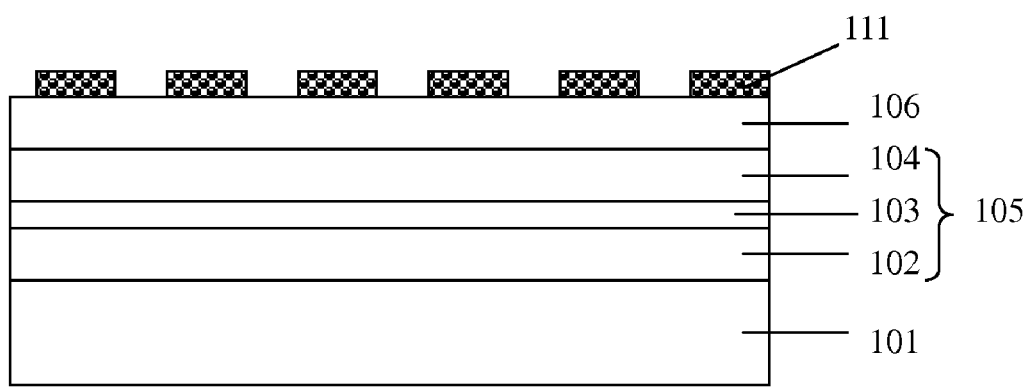
FIGS. 2A-2B illustrate a process flow of forming a light-emitting diode in accordance with another embodiment of the present application.
Figure 2B:
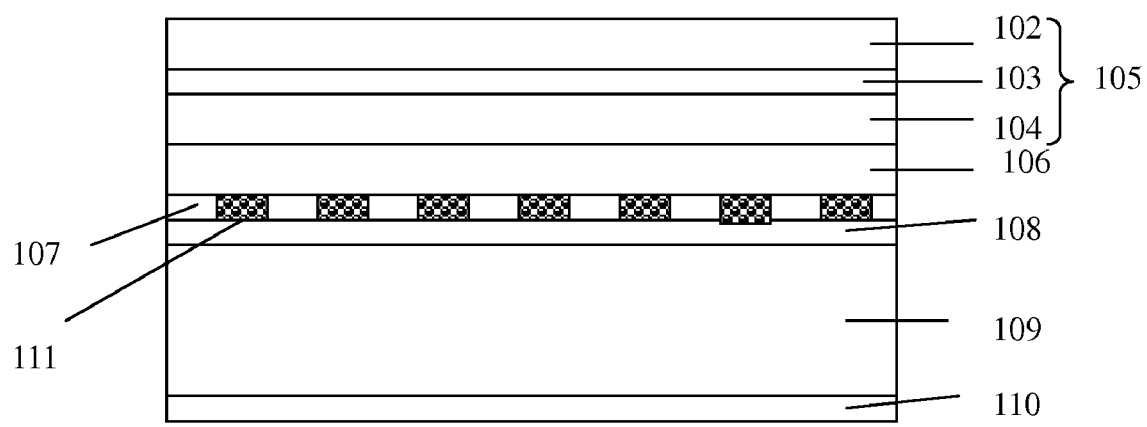
Figure 3A:
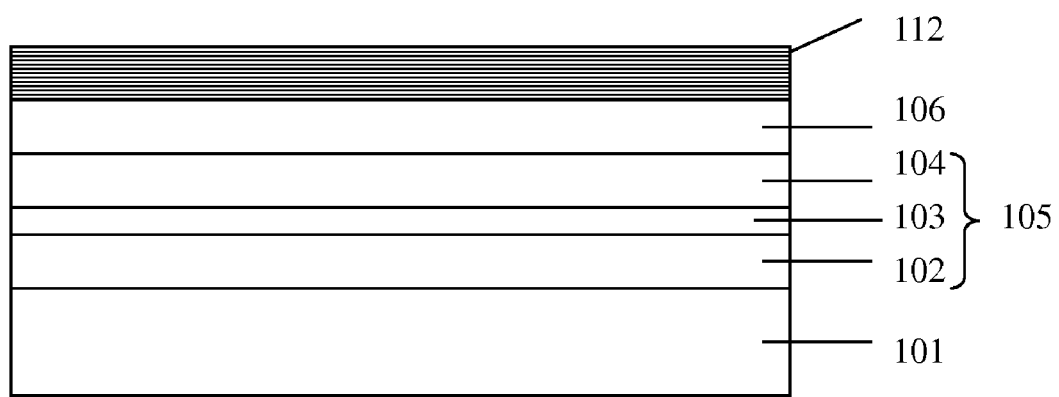
FIGS. 3A-3B illustrate a process flow of forming a light-emitting diode in accordance with further another embodiment of the present application.
Figure 3B:
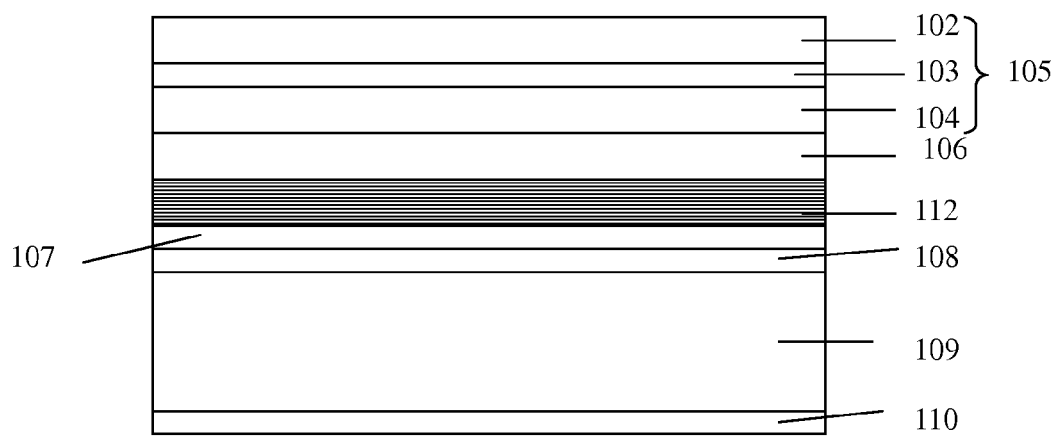

An intermediate layer 111 or a high strength and high toughness multiple-film layer 112 is formed on the reflective layer 106 if the difference of the thermal expansion coefficient between the semiconductor epitaxy structure 105 and the composite electroplating substrate 109 is large, then the composite electroplating process is proceeded. Referring to FIG. 2A, the intermediate layer 111 is a patterned structure and composed of the material(s) with low thermal expansion coefficient, they can be nickel, nickel cobalt alloy, nickel phosphorous alloy, nickel ion alloy, copper tungsten alloy, or copper molybdenum alloy. The intermediate layer can be a single layer or multiple layers structure. The following steps are the same as FIG. 1B to FIG. 1F to form the light-emitting diode structure 200 as shown in FIG. 2B. Referring to FIG. 3A, the purpose of forming the high strength and high toughness multiple-film layer 112 on the reflective layer 106 is to release the stress and to protect the semiconductor epitaxy structure when the difference of the thermal expansion coefficient between the semiconductor epitaxy structure 105 and the composite electroplating substrate 109 is large. The high strength and high toughness multiple-film layer is stacked alternately by the multiple hard films and the multiple soft films, and the material of the multiple-film layer be as a stack of aluminum nitride/aluminum, aluminum nitride/copper, or titanium tungsten/aluminum. The number of stacked layers and the thickness of each layer can be adjusted for product performance concerns. The following steps are the same as FIG. 1B to FIG. 1F to form the light-emitting diode structure 300 as shown in FIG. 3B.

Other embodiments of the application will be apparent to those skilled in the art from consideration of the specification and practice of the invention disclosed herein. It is intended that the specification and examples be considered as exemplary only, with a true scope and spirit of the invention being indicated by the following claims.

We claim:

1. A light-emitting diode, comprising:
   a composite substrate having a first surface and a second surface;
   a multiple-film layer on the first surface of the composite substrate, wherein the multiple-film layer is stacked alternately by multiple high strength films and multiple high toughness films;
   a reflective layer on the multiple-film layer; and
   a semiconductor epitaxy structure on the reflective layer, comprising a first conductivity type semiconductor layer, an active layer, and a second conductivity type semiconductor layer;
   wherein the composite substrate comprises two different materials.

2. The light-emitting diode according to claim 1, further comprising an interfacial layer between the composite substrate and the multiple-film layer.

3. The light-emitting diode according to claim 2, further comprising a seed layer between the interfacial layer and the multiple-film layer.

4. The light-emitting diode according to claim 1, further comprising a protection layer on the second surface of the composite substrate.

5. The light-emitting diode according to claim 1, wherein the composite substrate is formed by the composite electroplating method.

6. The light-emitting diode according to claim 3, wherein the seed layer comprises a stack of titanium/gold, titanium/copper, chromium/gold, or chromium/platinum/gold.

7. The light-emitting diode according to claim 1, wherein the reflective layer comprises a stack of titanium/aluminum, titanium/gold, or titanium/silver.

8. The light-emitting diode according to claim 1, wherein the first conductivity type semiconductor layer is n-type semiconductor containing at least one or more elements selected from the group consisting of gallium and nitrogen, and the second conductivity type semiconductor layer is p-type semiconductor containing at least one or more elements selected from the group consisting of gallium and nitrogen.

9. The light-emitting diode according to claim 1, wherein the first conductivity type semiconductor layer is n-type semiconductor containing at least one or more elements selected from the group consisting of aluminum, gallium, indium, and phosphorous, and the second conductivity type semiconductor layer is p-type semiconductor containing at least one or more elements selected from the group consisting of aluminum, gallium, indium, and phosphorous.

10. The light-emitting diode according to claim 4, wherein the material of the protection layer comprises gold or nickel.

11. The light-emitting diode according to claim 1, wherein the material of the multiple-film layer comprises a stack of aluminum nitride/aluminum, aluminum nitride/copper, or titanium tungsten/aluminum.

12. The light-emitting diode according to claim 2, wherein the material of the interfacial layer comprises copper, gold, nickel, or tin.

13. The light-emitting diode according to claim 1, wherein the composite substrate comprises copper-diamond, copper-silicon carbide, nickel-silicon carbide, carbon nanotube-copper, carbon nanotube-nickel, or carbon nanofiber-copper.

* * * * *